(12) United States Patent
Hsieh et al.

(10) Patent No.: US 8,089,060 B2
(45) Date of Patent: Jan. 3, 2012

(54) NON-VOLATILE MEMORY CELL AND FABRICATION METHOD THEREOF

(75) Inventors: Chun-I Hsieh, Hsinchu (TW); Shih-Shu Tsai, Zhongli (TW); Chang-Rong Wu, Banciao (TW)

(73) Assignee: Nanya Technology Corp., Tao-Yuan Hsien (TW)

( * ) Notice: Subject to any disclaimer, the term of this patent is extended or adjusted under 35 U.S.C. 154(b) by 40 days.

(21) Appl. No.: 12/507,253

(22) Filed: Jul. 22, 2009

(65) Prior Publication Data

US 2010/0193762 A1    Aug. 5, 2010

(30) Foreign Application Priority Data

Feb. 3, 2009    (TW) ................................ 98103428 A

(51) Int. Cl.
*H01L 29/04* (2006.01)
*H01L 21/331* (2006.01)

(52) U.S. Cl. ............. 257/3; 257/E47.001; 257/E21.327; 438/468

(58) Field of Classification Search ....... 257/4, E47.001, 257/E47.005, E21.327, 3, 143, 149; 365/148; 438/468, 385, 666
See application file for complete search history.

(56) References Cited

U.S. PATENT DOCUMENTS 6,825,489 B2 * 11/2004 Kozicki ........................ 257/42
7,382,647 B1 *  6/2008 Gopalakrishnan ............ 365/163

OTHER PUBLICATIONS

Kund et al, "Conductive Bridging RAM (CBRAM): An Emerging Non-Volatile Memory Technology Scalable to Sub 20nm", 2005, IEEE-IEDM Technical Digest, pp. 754-757.*

* cited by examiner

*Primary Examiner* — Thomas L Dickey
*Assistant Examiner* — Nikolay Yushin
(74) *Attorney, Agent, or Firm* — Volpe and Koenig, P.C.

(57) ABSTRACT

A non-volatile memory cell and a fabrication method thereof are provided. The non-volatile memory cell includes an anode; a cathode having a surface facing the anode; a specific structure disposed on the surface; and an ion conductor disposed among the anode, the cathode and the specific structure, wherein the specific structure is one of a bulging area on the surface of the cathode and an insulating layer with an opening.

29 Claims, 12 Drawing Sheets

NON-VOLATILE MEMORY CELL AND FABRICATION METHOD THEREOF

FIELD OF THE INVENTION

The present invention relates to a non-volatile memory cell and fabrication method thereof, and more particularly to a resistive non-volatile memory cell and fabrication method thereof.

BACKGROUND OF THE INVENTION

Resistive random-access memory (RRAM) has the potential to become the front runner among other non-volatile memories because of the benefits of the high-capacity, the fast switching speeds, the endurance of 1 billion write/read cycles, the lower currents and voltages, and the simpler and smaller cell structure.

Conductive-bridging random access memory (CBRAM) is one of the noticed non-volatile memories. The basic memory cell of CBRAM is composed of a solid electrolyte, e.g. Ag—Ge—Se and Cu/WO$_3$, sandwiched between two metal layers to form a programmable structure. Through the presence or absence of a metal channel formed in the solid electrolyte resulted from the reduction or the oxidation reactions of the metal ions in the solid electrolyte, the programmable structure can be used to store non-volatile information.

Please refer to FIG. 1, which is a diagram showing a conductive-bridging random access memory according to the prior art. In FIG. 1, the top electrode is an oxidizable electrode 10 where the oxidation and the reduction reactions will take place when a sufficient working voltage is applied thereto, and the bottom electrode is an inert electrode 11. For example, the material Ag could be used to form the oxidizable electrode 10 while the electrolyte is Ag—Ge—Se. When a sufficient negative voltage is supplied to the inert electrode 11, electrons will flow into the solid electrolyte 12 from the inert electrode 11 for initiating a reduction reaction of the metal ions in the solid electrolyte 12, and meanwhile, the reduced metal ions in the solid electrolyte 12 could be supplemented by the metal ions derived from the oxidation reaction at the oxidizable electrode 10. If the negative voltage is applied for a sufficient length of time, the metal atoms forms a plurality of dendrite structures 13 and grows from the inert electrode 11 toward the oxidizable electrode 10 by the continuous reduction reactions until any one of the dendrite structures 13 reaches the oxidizable electrode 10. The dendrite structure 13 connecting the oxidizable electrode 10 and the inert electrode 11 is a metal channel where the current passes through. During the formation of the metal channel, too many and too large dendrite structures 13 formed in the solid electrolyte 12 all cause the consumptions of voltage and metal materials. Furthermore, the differential growth rates of the metal channels between different memory cells cause the significant differences in the wording voltages and currents between different memory cells.

Hence, because of the defects in the prior arts, the inventors provide a non-volatile memory cell and fabrication method thereof to effectively overcome the demerits existing in the prior arts.

SUMMARY OF THE INVENTION

A resistive memory cell with a specific structure is proposed in the present invention. Because of the specific structure, which limit the surface of the cathode to a small region, which may have a largest electrical field, the metal atoms are expected to initiate the deposition from the small region; accordingly, the time and the resources, such as the metal materials, for forming the metal channel is conserved and thereby the uniformity of controlling different memory cells is increased.

In accordance with an aspect of the present invention, a non-volatile memory cell is provided. The non-volatile memory cell comprises an anode; a cathode having a surface facing the anode, a specific structure disposed on the surface; and an ion conductor disposed among the anode, the cathode and the specific structure, wherein the specific structure is one of a bulging area on the surface of the cathode and an insulating layer with an opening.

Preferably, the anode comprises a material being one selected from a group consisting of a silver, a gold and a copper.

Preferably, the cathode comprises a material being one selected from a group consisting of a tungsten, a nickel, a molybdenum, a platinum, a silicon, a tungsten nitride, a tantalum nitride and a titanium nitride.

Preferably, the specific structure is the bulging area on the surface of the cathode.

Preferably, the bulging area is a closest area on the surface of the cathode to the anode.

Preferably, the bulging area has a first region contacting with the ion conductor, the surface excluding the bulging area has a second region contacting with the ion conductor, and the first region is smaller than the second region.

Preferably, the non-volatile memory cell further comprises a metal channel formed in the ion conductor and extended from the bulging area to the anode.

Preferably, the metal channel is formed when a bias voltage is applied between the anode and the cathode.

Preferably, when the specific structure is the insulating layer with the opening, the surface of the cathode comprises a first region contacting with the ion conductor via the opening.

Preferably, the surface of the cathode has a second region covered with the insulating layer, and the first region is smaller than the second region.

Preferably, the non-volatile memory cell further comprises a metal channel formed in the ion conductor and extended from the first region of the cathode through the opening to the anode.

Preferably, when the specific structure is the insulating layer with the opening, the cathode includes a protruding area disposed on the surface of the cathode and inset into the opening.

Preferably, the protruding area has a first region contacting with the ion conductor, the surface of the cathode has a second region covered with the insulating layer, and the first region is smaller than the second region.

Preferably, the non-volatile memory cell further comprises a metal channel formed in the ion conductor and extended from the protruding area to the anode.

Preferably, the ion conductor comprises at least one of a chalcogenide and an oxide.

Preferably, the oxide is one selected from a group consisting of a germanium oxide, an arsenous oxide, a silver oxide, a copper oxide and a silicon oxide.

In accordance with another aspect of the present invention, a non-volatile memory cell is provided. The non-volatile memory cell comprises a first electrode; a second electrode having a surface facing the first electrode; a conducting structure disposed on the surface; and an ion conductor disposed among the first electrode, the second electrode and the conducting structure.

Preferably, the bulging area is a closest area on the surface of the second electrode to the first electrode.

Preferably, the first electrode is an oxidizable electrode.

Preferably, the first electrode comprises a material being one selected from a group consisting of a silver, a gold and a copper.

Preferably, the second electrode is an inert electrode.

Preferably, the second electrode comprises a material being one selected from a group consisting of a tungsten, a nickel, a molybdenum, a platinum, a silicon, a tungsten nitride, a tantalum nitride and a titanium nitride.

Preferably, the conducting structure is a bulging area on the surface of the second electrode.

Preferably, the non-volatile memory cell further comprises an insulating layer having an opening, and disposed on the surface of the second electrode.

Preferably, the opening is one of a trench and a hole.

Preferably, the conducting structure is located in the opening.

Preferably, a material of the conducting structure is the same as that of the ion conductor.

Preferably, the second electrode includes a protruding area disposed on the surface and inset into the opening.

In accordance with a further aspect of the present invention, a method of manufacturing a non-volatile memory cell is provided. The method comprises steps of providing a first electrode; providing a second electrode; disposing a specific structure on the surface, wherein the specific structure is one of a bulging area on the surface of the first electrode and an insulating layer with an opening; and providing an ion conductor deposited among the first electrode, the specific structure and the second electrode so as to form the non-volatile memory cell.

Preferably, when the specific structure is the bulging area on the surface of the second electrode, the method further comprises a step of applying a bias voltage between the first electrode and the second electrode to form a metal channel through the ion conductor from the bulging area toward the first electrode until the metal channel connects the first electrode to the second electrode.

Preferably, when the specific structure is the insulating layer with the opening, the method further comprises a step of applying a bias voltage between the first electrode and the second electrode to form a metal channel in the ion conductor from the second electrode through the opening toward the first electrode until the metal channel connects the first electrode to the second electrode.

Preferably, the method further comprises a step of providing a protruding area disposed on the surface of the second electrode and inset into the opening.

The above objects and advantages of the present invention will become more readily apparent to those ordinarily skilled in the art after reviewing the following detailed descriptions and accompanying drawings, in which:

BRIEF DESCRIPTION OF THE DRAWINGS

FIG. 4B is a diagram showing a preferred second step of the fabrication method of the second embodiment of the present invention;

FIG. 4C is a diagram showing a preferred third step of the fabrication method of the second embodiment of the present invention;

FIG. 4D is a diagram showing a preferred fourth step of the fabrication method of the second embodiment of the present invention;

FIG. 4E is a diagram showing a preferred fifth step of the fabrication method of the second embodiment of the present invention;

FIG. 5B is a diagram showing a preferred second step of the fabrication method of the third embodiment of the present invention;

FIG. 5C is a diagram showing a preferred third step of the fabrication method of the third embodiment of the present invention;

FIG. 5D is a diagram showing a preferred fourth step of the fabrication method of the third embodiment of the present invention;

FIG. 5E is a diagram showing a preferred fifth step of the fabrication method of the third embodiment of the present invention;

FIG. 7B is a diagram showing a preferred second step of one fabrication method of the fourth embodiment of the present invention;

FIG. 7C is a diagram showing a preferred third step of one fabrication method of the fourth embodiment of the present invention;

FIG. 8B is a diagram showing a preferred second step of another fabrication method of the fourth embodiment of the present invention;

FIG. 8C is a diagram showing a preferred third step of another fabrication method of the fourth embodiment of the present invention;

FIG. 8D is a diagram showing a preferred fourth step of another fabrication method of the fourth embodiment of the present invention;

FIG. 8E is a diagram showing a preferred fifth step of another fabrication method of the fourth embodiment of the present invention;

FIG. 8F is a diagram showing a preferred sixth step of another fabrication method of the fourth embodiment of the present invention;

FIG. 10B is a three-dimensional diagram showing a preferred second step of the fabrication method of the fifth embodiment of the present invention;

FIG. 10C is a three-dimensional diagram showing a preferred third step of the fabrication method of the fifth embodiment of the present invention;

FIG. 10D is a three-dimensional diagram showing a preferred fourth step of the fabrication method of the fifth embodiment of the present invention;

FIG. 10E is a three-dimensional diagram showing a preferred fifth step of the fabrication method of the fifth embodiment of the present invention;

FIG. 10F is a three-dimensional diagram showing a preferred sixth step of the fabrication method of the fifth embodiment of the present invention; and FIG. 10G is a three-dimensional diagram showing a preferred seventh step of the fabrication method of the fifth embodiment of the present invention.

DETAILED DESCRIPTION OF THE PREFERRED EMBODIMENT

The present invention will now be described more specifically with reference to the following embodiments. It is to be noted that the following descriptions of preferred embodiments of this invention are presented herein for the purposes of illustration and description only; it is not intended to be exhaustive or to be limited to the precise form disclosed.

Figure 1:
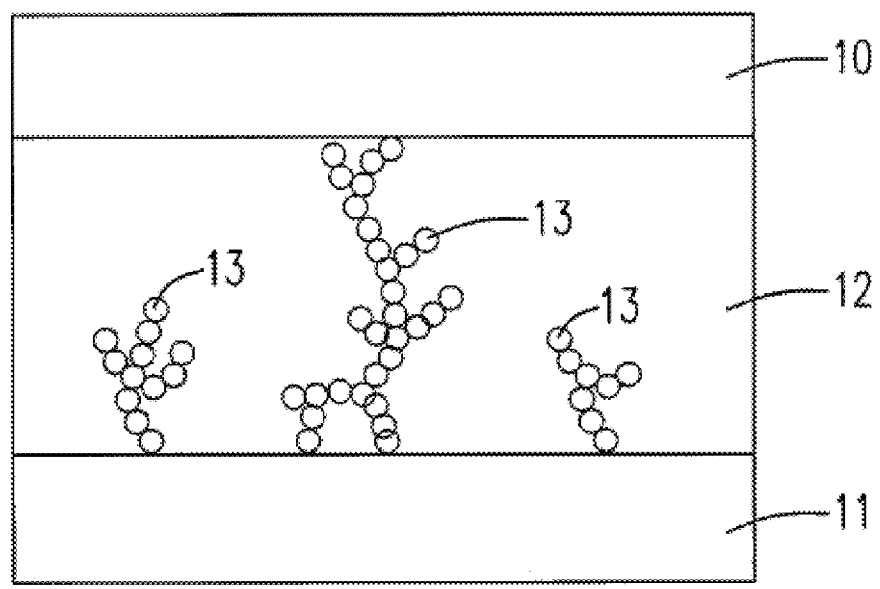
FIG. 1 is a diagram showing a conductive-bridging random access memory according to the prior art.
Figure 2:
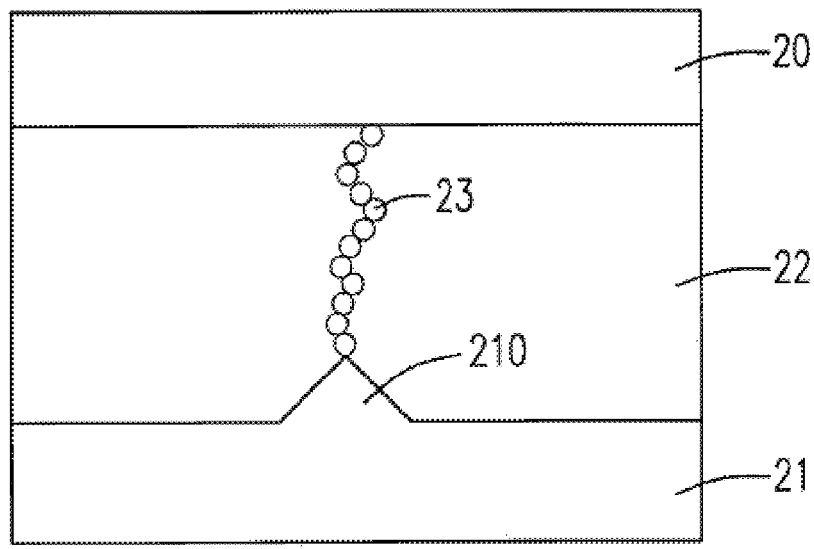
FIG. 2 is a diagram showing the side view of a non-volatile memory cell according to a first embodiment of the present invention.

Please refer to FIG. 2, which is a diagram showing the side view of a non-volatile memory cell according to a first embodiment of the present invention. As shown in FIG. 2, the top electrode is an oxidizable electrode 20 where the oxidation and the reduction reactions will take place when a sufficient working voltage is applied thereto, the bottom electrode is an inert electrode 21, and what is deposited between the top and the bottom electrodes is an ion conductor 22. The inert electrode 21 has a bulging terminal 210, which is a closest area to the oxidizable electrode 20, on a surface facing the oxidizable electrode 20. The surface area of the bulging terminal 210 contacting with the ion conductor 22 is smaller than the remaining area of the abovementioned surface facing the oxidizable electrode 20. During the writing process, the oxidizable electrode 20 is an anode and the inert electrode 21 is a cathode. When a sufficient negative voltage is supplied to the inert electrode 21, since the bulging terminal 210, which is a area closest to the anode, has the largest electrical field while compared with the remaining area at the cathode, the metal atoms produced via the reduction reaction will initially deposit at the bulging terminal 210, gradually grow toward the oxidizable electrode 20 and finally form a metal channel 23. There is no limitation to the form of the bulging terminal 210 and the position thereof at the inert electrode 21. As long as the bulging terminal 210 could provide a shortest route from the cathode to the anode, the purposes that a dendrite structure growing from the bulging terminal 210 becomes a fastest one reaching the anode and form the metal channel 23 will be achieved. Based on the same reasons, if an inverted voltage is applied, the metal channel 23 could oxidize to metal ions at a faster rate and thereby the memory cell could be switched to a high resistance state.

Please refer to FIG. 2 again. The oxidizable electrode 20 in this embodiment comprises a metal material, e.g. silver, gold or copper, that could be dissolved in the ion conductor 22 so as to increase the growth rate and the stability of the metal channel 23 in the ion conductor 22. The inert electrode 21 in this embodiment comprises an inert material, e.g. tungsten, nickel, molybdenum, platinum, silicon, tungsten nitride, tantalum nitride or titanium nitride, which is capable of reducing the formations of oxides, compounds or mixtures between the inert electrode 21 and the ion conductor 22, wherein the mentioned compounds or mixtures usually have a higher resistance value than that of the ion conductor 22 or the inert materials.

Figure 3:
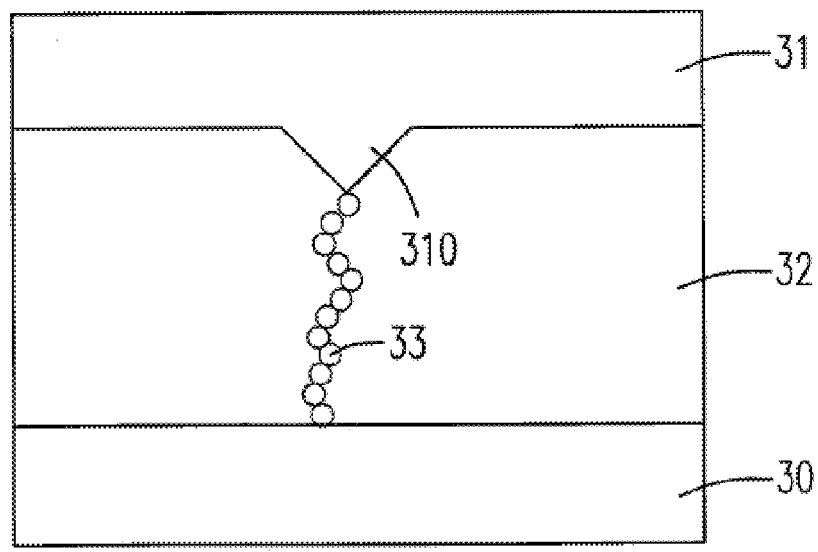
FIG. 3 is a diagram showing the side view of a non-volatile memory cell according to a second embodiment of the present invention.

Please refer to FIG. 3, which is a diagram showing the side view of a non-volatile memory cell according to a second embodiment of the present invention. The difference between the first and the second embodiments is that in the second embodiment, the top electrode is a nonplanar inert electrode 31 with a bulging terminal 310 and the bottom electrode is an oxidizable electrode 30. Similar to the concept disclosed in the first embodiment, the metal channel 33 within the ion conductor 32 is gradually formed from the bulging terminal 310 toward the oxidizable electrode 30.

Figure 4A:
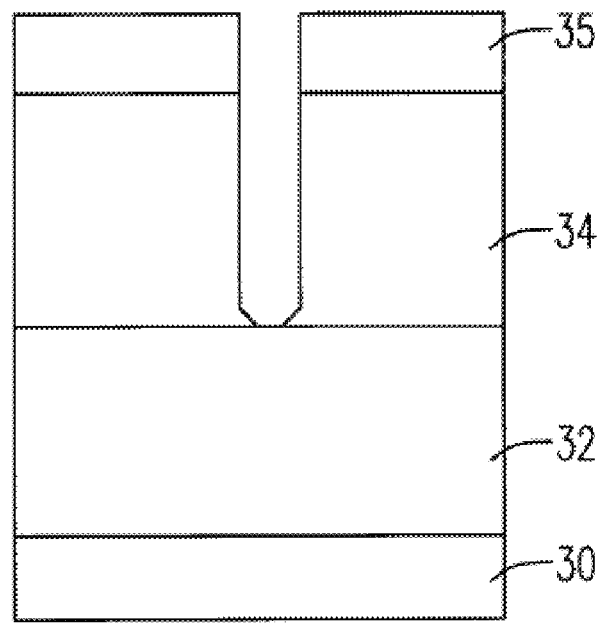
FIGS. 4A-4E are a diagrams showing a preferred first step of a fabrication method of a second embodiment of the present invention.
Figure 4B:
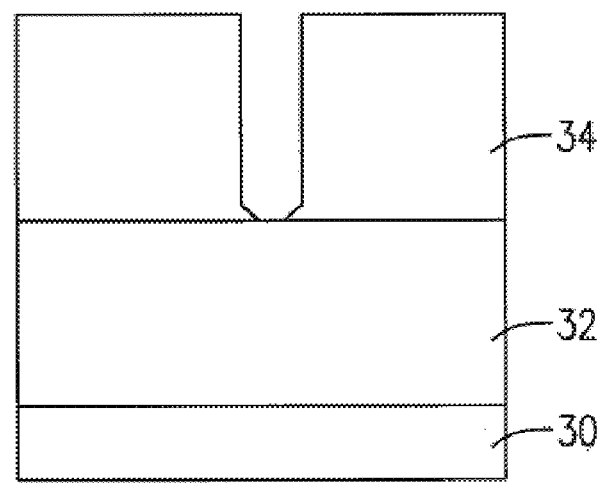
Figure 4C:
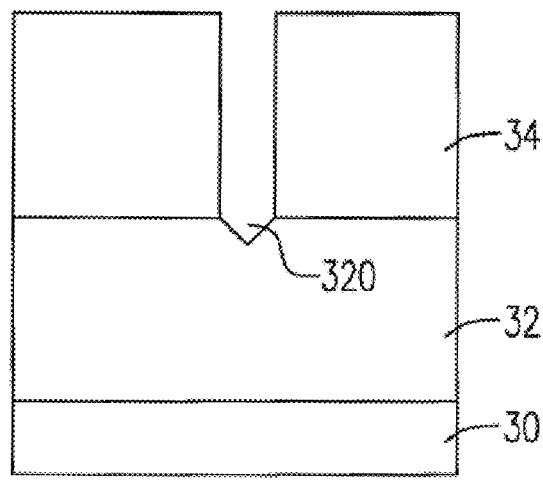
Figure 4D:
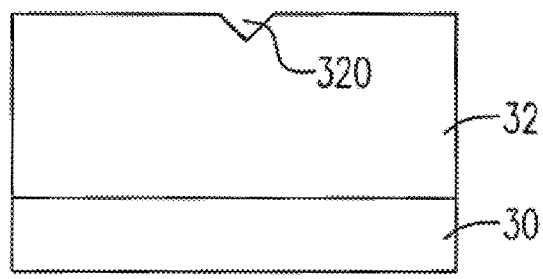
Figure 4E:
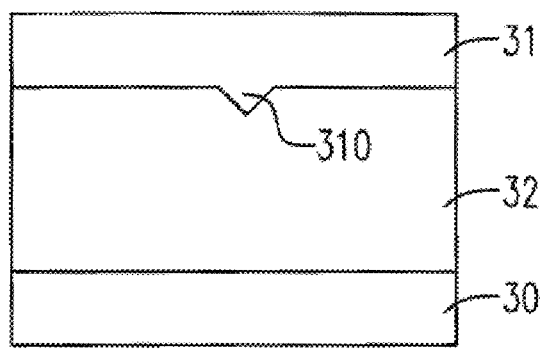

Please refer to FIGS. 4A-4E, which are diagrams showing a fabrication method of the second embodiment of the present invention. As shown in FIGS. 4A-4E, simplified plane processes are provided for fabricating the non-volatile memory cell of the present invention. At first, a patterned structure composed of an oxidizable electrode 30, an ion conductor 32, a hard mask 34 and a photoresist layer 35 is formed (shown in FIG. 4A), wherein the patterning process includes lithography and etching processes for transferring a predefined pattern to the abovementioned structure. The lithography process includes the coating of the photoresist layer 35, the soft baking, the mask align, the exposure, the post exposure baking, the development, the hard baking, and the dissolution of the photoresist layer 35. The etching process could be a wet etching, a dry etching, a reactive ion-beam etching or other suitable etching processes. The hard mask 34 is a silicon oxide layer, a silicon nitride layer, a silicon oxynitride layer or a layer with a material selected from the combination of the abovementioned materials and is formed by a chemical vapor deposition, a physical vapor deposition, or a atomic layer deposition process. After the photoresist layer 35 is dissolved (as shown in FIG. 4B), a dry etching procedure is processed for forming a hollow 320 on the top surface of the ion conductor 32 (as shown in FIG. 4C). Afterward, the hard mask 34 is removed and thereby the top surface and the hollow thereon of the ion conductor 32 are exposed to the air (as shown in FIG. 4D). Finally, the inert electrode 31 is deposited onto the top surface of the ion conductor 32 and consequently a top electrode having a bulging terminal 310 is obtained (as shown in FIG. 4E).

Figure 5A:
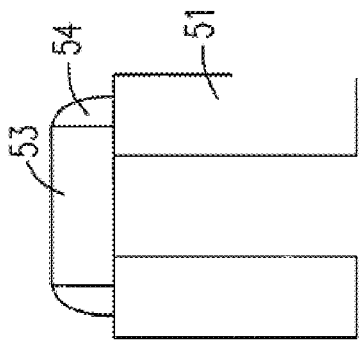
FIGS. 5A-5E are a diagrams showing a preferred first step of a fabrication method of a third embodiment of the present invention.
Figure 5B:
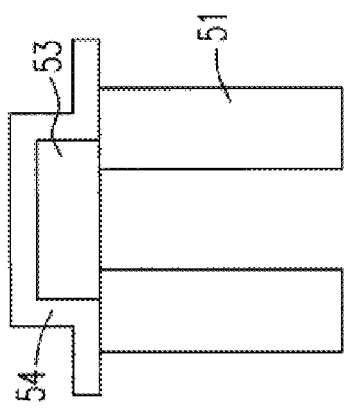
Figure 5C:
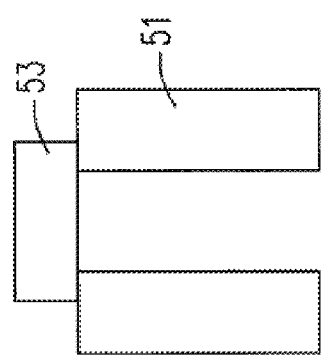
Figure 5D:
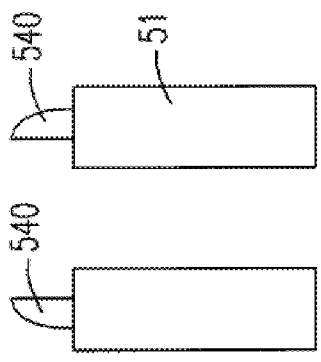
Figure 5E:
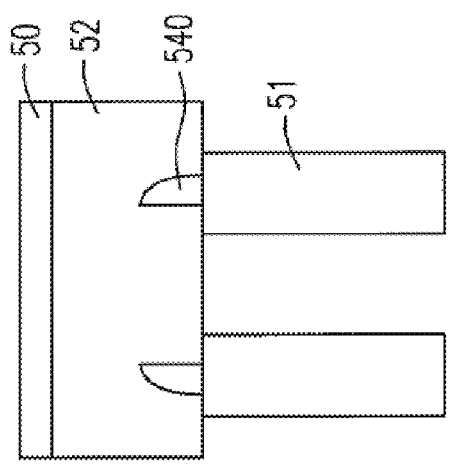

Please refer to FIGS. 5A-5E, which are diagrams showing a fabrication method of a third embodiment of the present invention. As shown in FIG. 5A, first of all, an oxide layer 53 is deposited on an inert electrode 51 serving as the bottom electrode and merely covers partial of the top surface of the inert electrode 51. Afterward, a metal layer 54 having a material the same as that of the inert electrode 51 is deposited on the structure disclosed in FIG. 5A by a suitable deposition process and covers all exposed portions of the oxide layer 53 and the uncovered top surface of the inert electrode 51 (as shown in FIG. 5B). Subsequently, after the metal layer 54 is etched back by using a back-etching method, portions of the metal layer 54 remain on the sidewalls of the exposed oxide layer 53 (as shown in FIG. 5C), wherein the back-etching method is an anisotropic etching method, e.g. the dry etching including plasma etching, reactive ion etching and so on. Subsequently, the procedure of removing the oxide layer 53 by a dry etching process is processed and the remaining structure is the inert electrode 51 with a bulging terminal 540 on the surface thereof (as shown in FIG. 5D). Finally, as shown in FIG. 5E, the ion conductor 52 and the oxidizable electrode 50 are deposited orderly onto the unplanar surface of the bottom electrode, and consequently a CBRAM having a bottom electrode with a bulging terminal 540 is completed.

Figure 6:
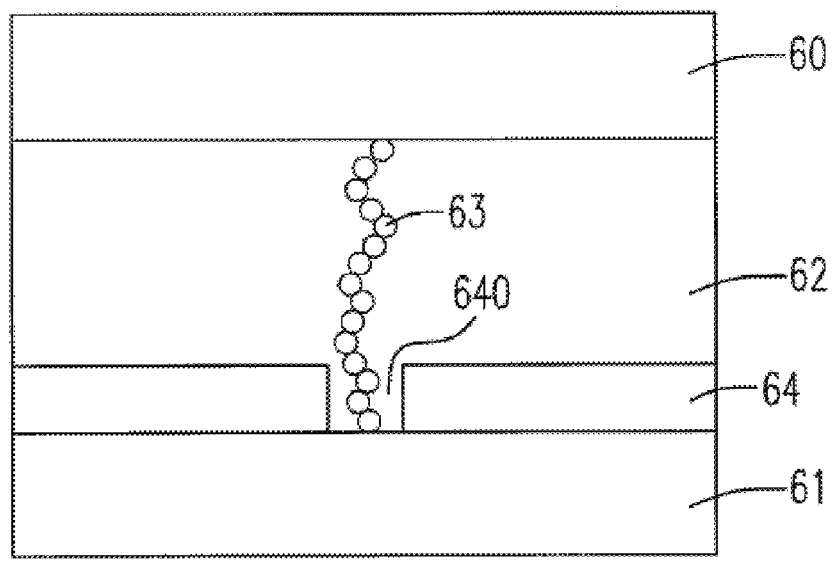
FIG. 6 is a diagram showing the side view of a non-volatile memory cell according to a fourth embodiment of the present invention.

Please refer to FIG. 6, which is a diagram showing the side view of a non-volatile memory cell according to a fourth embodiment of the present invention. As shown in FIG. 6, the top electrode is an oxidizable electrode 60 where the oxidation and the reduction reactions will take place when a sufficient working voltage is applied thereto, the bottom electrode is an inert electrode 61, an insulating layer 64 having an opening 640 is configured on the inert electrode 61, and what is deposited among the top and the bottom electrodes and the insulating layer 64 is an ion conductor 62. The materials of the oxidizable electrode 60, the inert electrode 61 and the ion conductor 62 in this embodiment are similar to those in the first embodiment. The materials of the insulating layer 64 could be oxide, nitride or other suitable insulating materials known in this field. The surface of the inert electrode 61 comprises a first region contacting with the ion conductor via the opening 640 and a second region covered with the insulating layer 64, wherein the first region is smaller than the second region. During the writing process, the oxidizable electrode 60 is an anode and the inert electrode 61 is a cathode. When a sufficient negative voltage is supplied to the inert electrode 61, since the second region of the surface of the inert electrode 61 is covered with the insulating layer 64, the metal atoms produced via the reduction reaction will initially deposit at the first region of the inert electrode 61, gradually grow through the opening 640 of the insulating layer 64 toward the oxidizable electrode 60 and finally form a metal channel 63 in the ion conductor 62. There is no limitation to the form of the opening 640 and the position thereof. As long as the insulating layer 64 could reduce the region, which contacts with the ion conductor 62, of the surface of the cathode to a small limited region, e.g. 1-100 $nm^2$ and preferably about 25 $nm^2$, the purposes that a dendrite structure only being able to grow from the limited region of the cathode and form the metal channel 63 connecting the cathode and the anode will be achieved. Based on the same reasons, if an inverted voltage is applied, the metal channel 63 could oxidize to metal ions at a faster rate and thereby the memory cell could be switched to a high resistance state.

Figure 7A:
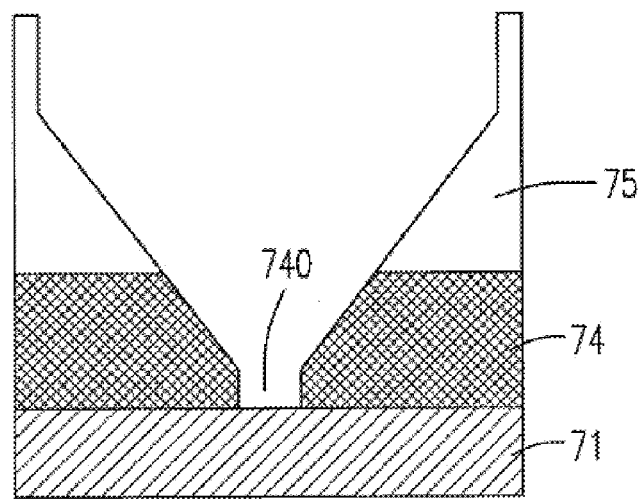
FIGS. 7A-7C are a diagrams showing a preferred first step of onea fabrication method of a fourth embodiment of the present invention.
Figure 7B:
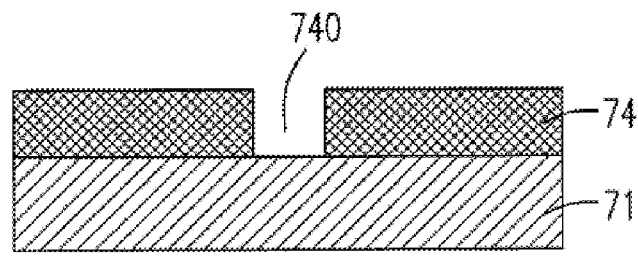
Figure 7C:
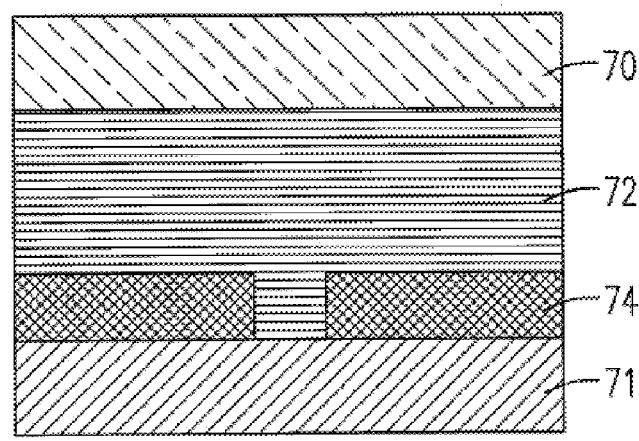

Please refer to FIGS. 7A-7C, which are diagrams showing a fabrication method of the fourth embodiment of the present invention. As shown in FIG. 7A, from bottom to top, there are disposed an inert electrode 71, an insulating layer 74 and a mask layer 75. After an etching process, there will be a tip 740 formed in the insulating layer. After the formation of the tip, an insulating layer 74 having an opening 740 is formed by, for example, a chemical mechanical polishing (CMP) process (as shown in FIG. 7B). Finally, as shown in FIG. 7C, an ion conductor 72 and an oxidizable electrode 70 are deposited orderly onto the unplanar surface of the insulating layer 74, and consequently the fourth embodiment is completed.

Figure 8A:
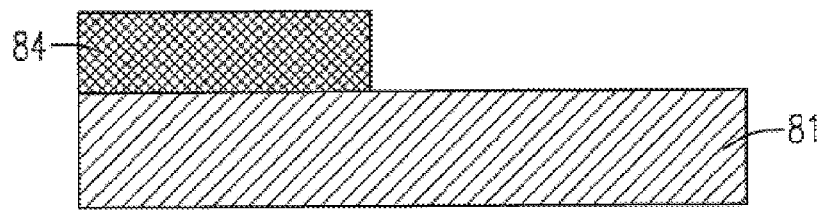
FIGS. 8A-8F are a diagrams showing a preferred first step of another fabrication method of a fourth embodiment of the present invention.
Figure 8B:
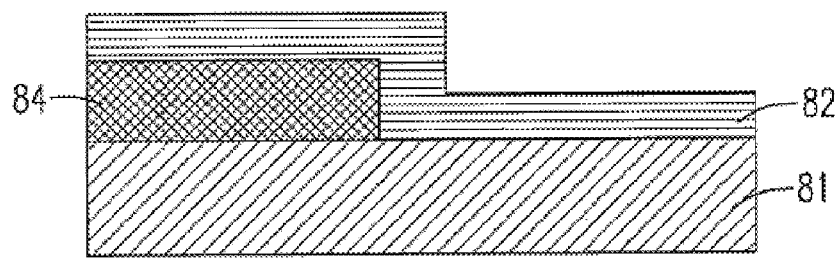
Figure 8C:
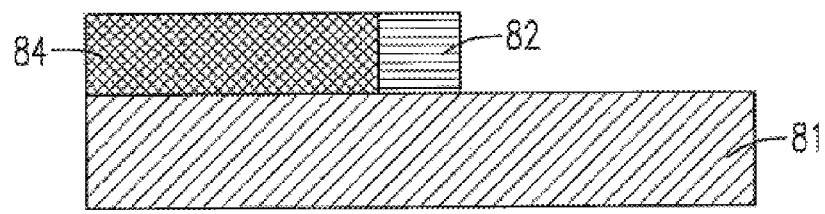
Figure 8D:
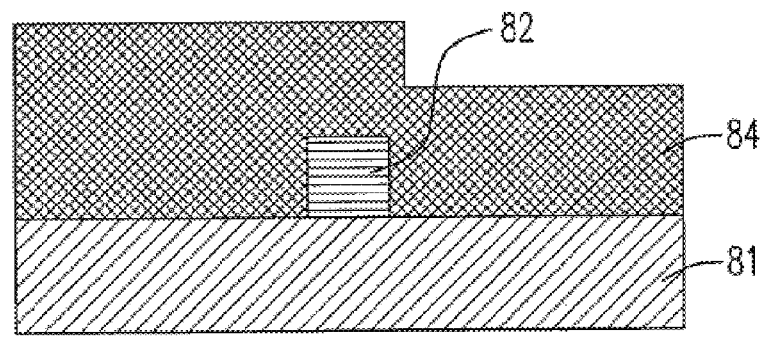
Figure 8E:
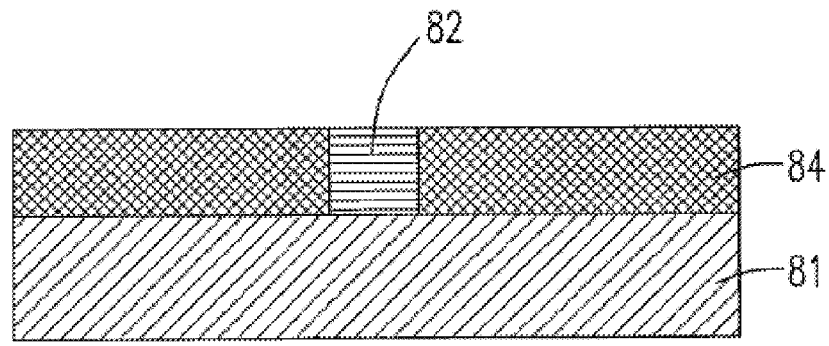
Figure 8F:
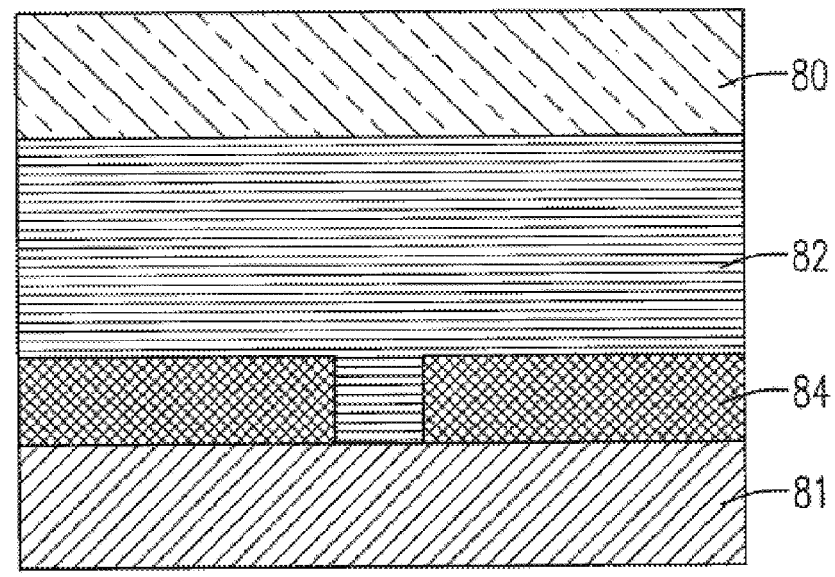

Please refer to FIGS. 8A-8F, which are diagrams showing another fabrication method of the fourth embodiment of the present invention. As shown in FIG. 8A, an insulating layer 84 with a sidewall is patterned on an inert electrode 81, wherein partial surface of the inert electrode 81 is exposed. After depositing an ion conductor 82 covering the insulating layer 84 and the exposed partial surface of the inert electrode 81 (as shown in FIG. 8B), a portion of the ion conductor 82 is formed on the sidewall of the insulating layer 84 by an etching back process (as shown in FIG. 8C). The insulating layer 84 is further deposited on the structure shown in FIG. 8C and thereby covering all exposed region thereof (as shown in FIG. 8D). Subsequently, the insulating layer 84 is planarized to a level where the portion of the ion conductor 82 is exposed by, for example, a chemical mechanical polishing (CMP) process (as shown in FIG. 8E). Finally, as shown in FIG. 8F, the ion conductor 82 and an oxidizable electrode 80 are deposited orderly onto the planar top surface of the structure shown in FIG. 8E, and consequently the fourth embodiment is completed.

Figure 9:
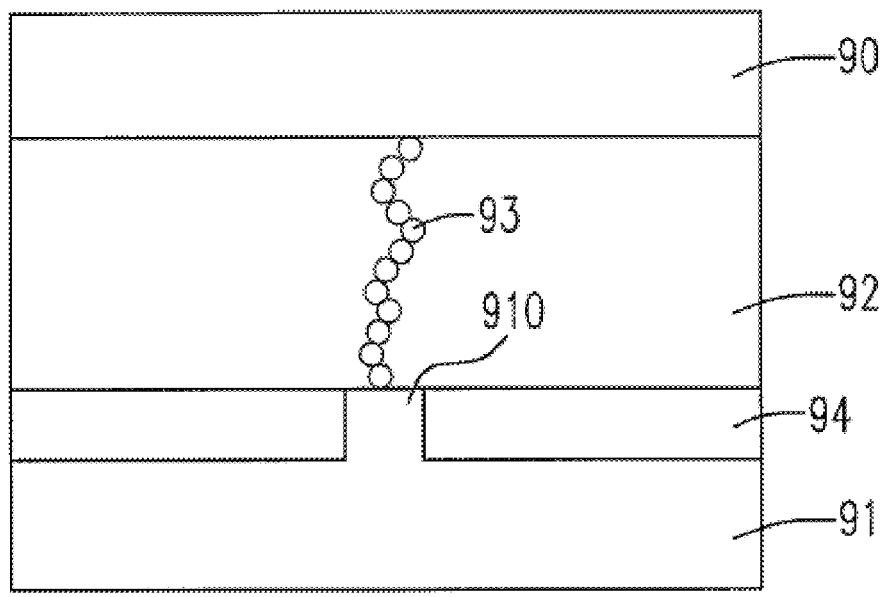
FIG. 9 is a diagram showing the side view of a non-volatile memory cell according to a fifth embodiment of the present invention.

Please refer to FIG. 9, which is a diagram showing the side view of a non-volatile memory cell according to a fifth embodiment of the present invention. As shown in FIG. 9, the top electrode is an oxidizable electrode 90, the bottom electrode is an inert electrode 91 having a bulging terminal 910 on a surface facing the oxidizable electrode 90, an insulating layer 94 having an opening where the bulging terminal 910 is inset, is configured on the inert electrode 91, and what is deposited among the top and the bottom electrodes and the insulating layer 94 is an ion conductor 92. The bulging terminal 910 is a closest area of the inert electrode 91 to the oxidizable electrode 90. The inert electrode's surface facing the oxidizable electrode has a first region contacting with the ion conductor 92 and a second region covered with the insulating layer 94, wherein the first region is smaller than the second region. The materials of the oxidizable electrode 90, the inert electrode 91 and the ion conductor 92 in this embodiment are similar to those in the first embodiment. During the writing process, the oxidizable electrode 90 is an anode and the inert electrode 91 is a cathode. When a sufficient negative voltage is supplied to the inert electrode 91, since the bulging terminal 910, which is a area closest to the anode, has the largest electrical field while compared with the remaining area at the cathode, and the remaining area is covered with the insulating layer 94, the metal atoms produced via the reduction reaction will initially deposit at the bulging terminal 910, gradually grow toward the oxidizable electrode 90 and form a metal channel 93. There is no limitation to the form of the bulging terminal 910 and the position thereof at the inert electrode 91. As long as the bulging terminal 910 could provide a shortest route from the cathode to the anode, the purposes that a dendrite structure growing from the bulging terminal 910 becomes a fastest one reaching the anode and forms the metal channel 93 will be achieved.

Figure 10A:
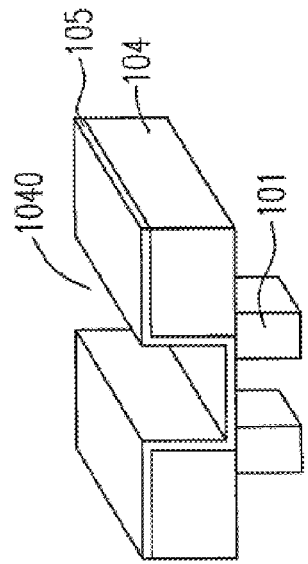
FIGS. 10A-10H are a three-dimensional diagrams showing a preferred first step of another fabrication method of a fifth embodiment of the present invention.
Figure 10B:
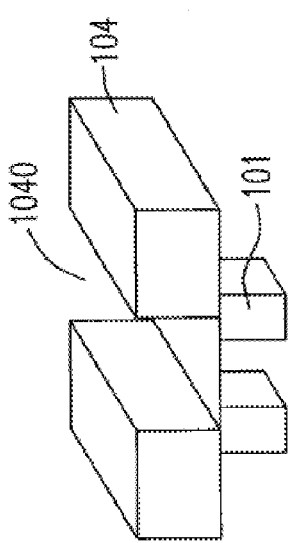
Figure 10C:
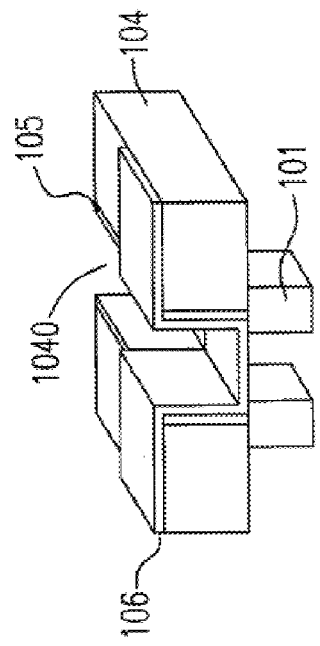
Figure 10D:
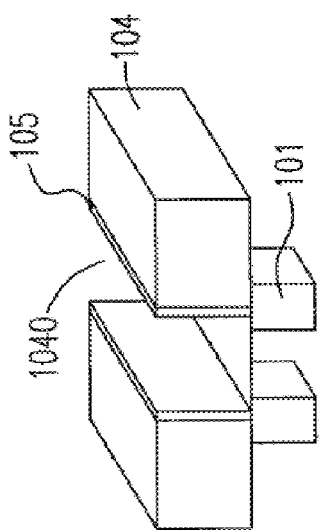
Figure 10F:
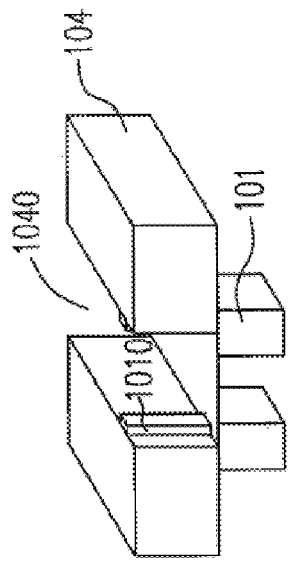
Figure 10H:
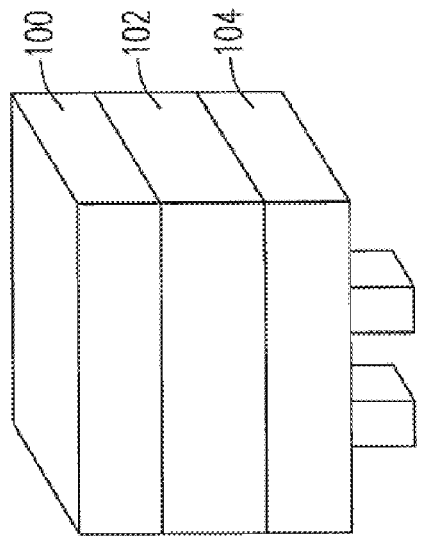
Figure 10E:
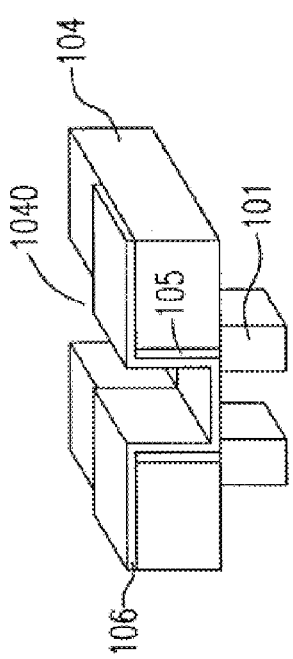
Figure 10G:
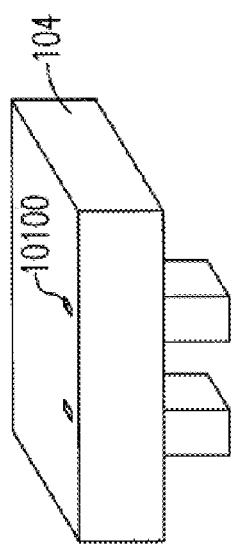

Please refer to FIGS. 10A-10F, which are three-dimensional diagrams showing another fabrication method of the fifth embodiment of the present invention. As shown in FIG. 10A, there are inert electrodes 101 and an insulating layer 104 disposed on the inert electrodes, wherein the insulating layer 104 has a trench 1040 formed by a pattern process and a lithography process. As shown in FIG. 10B, a metal layer 105 is deposited on the structure shown in FIG. 10A and accordingly all the exposed portion thereof is covered by the metal layer 105. After an etching back process, part of the metal layer 105 is remained on the sidewall of the trench 1040 (as shown in FIG. 10C). As shown in FIG. 10D, consequently, a mask layer 106, which might be an oxide or a nitride layer, is patterned and deposited on the structure shown in FIG. 10C. The mask layer 106, which has a strip shape, is aligned on the inert electrodes 101, and a portion of the metal layer 105 on the sidewall of the trench is not covered by the mask layer 106. As shown in FIG. 10E, said portion of the metal layer 105 not covered by the mask layer 106 is removed by an etching back process. The remaining metal layer 105 covered by the mask layer 106 is shrunk by a wet etching process, and after removing the mask layer 106, a pillar cathode 1010 on the sidewall of the trench 1040 is exposed (as shown in FIG. 10F). Consequently, the material of the insulating layer 104 is filled into the trench 1040. After a CMP process, the pillar cathode 1010 is embedded in the insulating layer 104 with a top surface 10100 thereof exposed (as shown in FIG. 10G). Finally, as shown in FIG. 10H, the ion conductor 102 and an oxidizable electrode 100 are deposited orderly onto the planar top surface of the insulating layer 104, and consequently the fifth embodiment is completed.

During the writing process of the CBRAM provided in the present embodiments, a larger power applied to the CBRAM will cause a larger dendrite structure forming the metal channel within the ion conductor, wherein the amount of the power is controlled by the operating time, current, voltage and/or other relevant factors. The concept of the embodiments provided in this application is to reduce the time and resources, e.g. the voltage, the metal materials, etc., for the formation and the dissolution of the metal channel connecting two electrodes by a specific structure, which maybe a bulging area, a insulating layer with at least one opening or a insulating layer with an opening where filled with a bulging area, on a surface of either the top or the bottom electrodes. Since the bulging terminal on the surface of the electrode would have the largest electrical field, the reduction reaction is apt to occur from the bulging terminal. In addition, since the insulating layer with an opening limits the surface of the cathode to a small region contacting with the ion conductor, the reduction reaction is restricted to occur from the small region. Furthermore, since the bulging terminal is a closest area on the surface of the cathode to the anode, it is apparent that the dendrite structure forming from the bulging terminal will reach the anode to form a conductive path faster than other dendrite structures forming from the surface excluding the bulging terminal, which will significantly reduce the writing voltage. The operating voltage, current and time of non-volatile memory cells with the concept of the present embodiments could be effectively controlled by modulating the distance between the bulging terminal or the small region limited by the insulating layer with an opening and the anode, and accordingly during manufacturing non-volatile memory cells, the difference therebetween could be reduced. The technical schemes where the shape, position or the manufacturing method of the specific structure in the embodiments is modified by one skilled in the art are all protected in the present invention.

While the invention has been described in terms of what is presently considered to be the most practical and preferred embodiments, it is to be understood that the invention needs not be limited to the disclose embodiments. Therefore, it is intended to cover various modifications and similar arrangements included within the spirit and scope of the appended claims, which are to be accorded with the broadest interpretation so as to encompass all such modifications and similar structures.

What is claimed is:

1. A non-volatile memory cell, comprising:
   an anode;
   a cathode having a surface facing the anode;
   a specific structure disposed on the surface;
   an ion conductor disposed among the anode, the cathode and the specific structure, wherein the specific structure is a bulging area on the surface of the cathode, the bulging area has a first region contacting with the ion conductor, the surface excluding the bulging area has a second region contacting with the ion conductor, and the first region is smaller than the second region; and
   a metal channel formed in the ion conductor and extended from the bulging area to the anode.

2. A non-volatile memory cell as claimed in claim 1, wherein the cathode comprises a material being one selected from a group consisting of a tungsten, a nickel, a molybdenum, a platinum, a silicon, a tungsten nitride, a tantalum nitride and a titanium nitride.

3. A non-volatile memory cell as claimed in claim 1, wherein the bulging area is a closest area on the surface of the cathode to the anode.

4. A non-volatile memory cell as claimed in claim 1, wherein the metal channel is formed when a bias voltage is applied between the anode and the cathode.

5. A non-volatile memory cell as claimed in claim 1, wherein the anode comprises a material being one selected from a group consisting of a silver, a gold and a copper.

6. A non-volatile memory cell as claimed in claim 5, wherein the cathode comprises a material being one selected from a group consisting of a tungsten, a nickel, a molybdenum, a platinum, a silicon, a tungsten nitride, a tantalum nitride and a titanium nitride.

7. A non-volatile memory cell as claimed in claim 1, wherein the ion conductor comprises at least one of a chalcogenide and an oxide.

8. A non-volatile memory cell as claimed in claim 7, wherein the oxide comprises one selected from a group consisting of a germanium oxide, an arsenous oxide, a silver oxide, a copper oxide and a silicon oxide.

9. A non-volatile memory cell, comprising:
   a first electrode;
   a second electrode having a surface facing the first electrode;
   a conducting structure disposed on the surface, wherein the conducting structure is a bulging area; and
   an ion conductor disposed among the first electrode, the second electrode and the conducting structure, wherein the bulging area has a first region contacting with the ion conductor, the surface excluding the bulging area has a second region contacting with the ion conductor, and the first region is smaller than the second region.

10. A non-volatile memory cell as claimed in claim 9, wherein the bulging area is a closest area on the surface of the second electrode to the first electrode.

11. A non-volatile memory cell as claimed in claim 9, wherein the surface of the second electrode has a third region covered with the bulging area, and the third region is smaller than the second region.

12. A non-volatile memory cell as claimed in claim 9, wherein the first electrode is an oxidizable electrode.

13. A non-volatile memory cell as claimed in claim 12, wherein the oxidizable electrode comprises a material being one selected from a group consisting of a silver, a gold and a copper.

14. A non-volatile memory cell as claimed in claim 9, wherein the second electrode is an inert electrode.

15. A non-volatile memory cell as claimed in claim 14, wherein the inert electrode comprises a material being one selected from a group consisting of a tungsten, a nickel, a molybdenum, a platinum, a silicon, a tungsten nitride, a tantalum nitride and a titanium nitride.

16. A non-volatile memory cell as claimed in claim 9, further comprising a metal channel formed in the ion conductor, and extended from the bulging area to the first electrode.

17. A non-volatile memory cell as claimed in claim 16, wherein the metal channel is formed when a bias voltage is applied between the first electrode and the second electrode.

18. A non-volatile memory cell as claimed in claim 9, further comprising a metal channel formed in the ion conductor and extended from the conducting structure to the first electrode.

19. A non-volatile memory cell as claimed in claim 18, wherein the metal channel is formed when a bias voltage is applied between the first electrode and the second electrode.

20. A non-volatile memory cell as claimed in claim 9, wherein the ion conductor comprises at least one of a chalcogenide and an oxide.

21. A non-volatile memory cell as claimed in claim 20, wherein the oxide comprises one selected from a group consisting of a germanium oxide, an arsenous oxide, a silver oxide, a copper oxide and a silicon oxide.

22. A non-volatile memory cell as claimed in claim 9, further comprising an insulating layer having an opening, and disposed on the surface of the second electrode.

23. A non-volatile memory cell as claimed in claim 22, wherein the opening is one of a trench and a hole.

24. A non-volatile memory cell as claimed in claim 22, wherein the conducting structure is located in the opening.

25. A non-volatile memory cell as claimed in claim 24, wherein a material of the conducting structure is the same as that of the ion conductor.

26. A method of manufacturing a non-volatile memory cell, comprising steps of:
provide a first electrode;
providing a second electrode having a surface facing the first electrode;
disposing a specific structure on the surface, wherein the specific structure is a bulging area on the surface of the second electrode; and
providing an ion conductor disposed among the first electrode, the second electrode and the specific structure so as to form the non-volatile memory cell, wherein the bulging area has a first region contacting with the ion conductor, the surface has a second region contacting with the ion conductor, and the first region is smaller than the second region.

27. A method as claimed in claim 26, wherein the first electrode comprises a material being one selected from a group consisting of a silver, a gold and a copper.

28. A method as claimed in claim 26, wherein the second electrode comprises a material selected from a group consisting of a tungsten, a nickel, a molybdenum, a platinum, a silicon, a tungsten nitride, a tantalum nitride and a titanium nitride.

29. A method as claimed in claim 26, further comprising a step of:
applying a bias voltage between the first electrode and the second electrode to form a metal channel through the ion conductor from the bulging area toward the first electrode until the metal channel connects the first electrode to the second electrode.

* * * * *